United States Patent [19]
Voss

[11] Patent Number: 5,923,582
[45] Date of Patent: Jul. 13, 1999

[54] SRAM WITH ROM FUNCTIONALITY

[75] Inventor: Peter H. Voss, Aromas, Calif.

[73] Assignee: Cypress Semiconductor Corp., San Jose, Calif.

[21] Appl. No.: 08/868,062

[22] Filed: Jun. 3, 1997

[51] Int. Cl.$^6$ .................................................. G11C 11/00
[52] U.S. Cl. ........................ 365/154; 365/104; 365/156
[58] Field of Search .................................. 365/154, 156, 365/104

[56] References Cited

U.S. PATENT DOCUMENTS

| | | | |
|---|---|---|---|
| 3,798,621 | 3/1974 | Baitinger et al. | 340/173 R |
| 4,149,268 | 4/1979 | Waters | 365/95 |
| 4,207,615 | 6/1980 | Mar | 365/154 |
| 4,418,401 | 11/1983 | Bansal | 365/95 |
| 4,510,584 | 4/1985 | Dias et al. | 365/203 |
| 4,538,246 | 8/1985 | Wang et al. | 365/226 |
| 4,638,465 | 1/1987 | Rosini et al. | 365/228 |
| 4,821,233 | 4/1989 | Hsieh | 365/203 |
| 4,855,803 | 8/1989 | Azumai | 365/154 |
| 5,051,958 | 9/1991 | Arakawa | 365/154 |
| 5,124,774 | 6/1992 | Godinho et al. | 357/41 |
| 5,148,390 | 9/1992 | Hsieh | 365/95 |
| 5,230,058 | 7/1993 | Kumar et al. | 395/800 |
| 5,287,481 | 2/1994 | Lin | 395/425 |
| 5,289,475 | 2/1994 | Slemmer | 371/21.1 |
| 5,343,437 | 8/1994 | Johnson et al. | 365/230.03 |
| 5,353,248 | 10/1994 | Gupta | 365/154 |
| 5,365,475 | 11/1994 | Matsumura | 365/154 |
| 5,396,464 | 3/1995 | Slemmer | 365/201 |
| 5,414,827 | 5/1995 | Lin | 395/425 |
| 5,422,852 | 6/1995 | Houston et al. | 365/201 |
| 5,453,950 | 9/1995 | Voss et al. | 365/156 |
| 5,457,695 | 10/1995 | Houston | 371/21.2 |
| 5,473,185 | 12/1995 | Pfiester et al. | 257/399 |

FOREIGN PATENT DOCUMENTS 0488612  3/1992  European Pat. Off. .

OTHER PUBLICATIONS

Borgen, United States Statutory Invention Registration, Reg. No.: H1414, Feb. 7, 1995.

*Primary Examiner*—Son T. Dinh
*Attorney, Agent, or Firm*—Blakely, Sokoloff, Taylor & Zafman LLP

[57] ABSTRACT

A memory device including a first block of random access memory (RAM) cells having preprogrammed states, a second block of random access memory cells, and a select circuit configured to reset the first block of RAM cells to their preprogrammed states. When the first block of memory cells are reset to their preprogrammed states, the first block of memory cells may function as ROM memory cells that may be accessed at RAM speeds. The first block of RAM cells may not require additional nonvolatile circuitry in order to perform the ROM function; rather, the first block of RAM cells may each be configured to operate as both a volatile and nonvolatile memory cell using the same cell structure. For one embodiment, the select circuit alters the power applied to the first block of RAM cells to cause these RAM cells to perform a ROM function. Since, the first block of RAM cells may store RAM data when the device operates in RAM mode, and may store preprogrammed ROM data when reset by the select circuit, the first block of RAM cells may have a storage capacity that is greater than the number of RAM cells in the first block.

17 Claims, 6 Drawing Sheets

SRAM WITH ROM FUNCTIONALITY

BACKGROUND OF THE INVENTION

1. Field of the Invention

The present invention relates to memory circuits. More particularly, the present invention relates to a random access memory cell configurable to store preprogrammed data.

2. Background

Many computer systems include volatile and nonvolatile memory devices. Volatile memory is typically faster than nonvolatile memory. Thus, volatile memory is generally used to store data that a system may need to retrieve quickly such as data used by a computer program. While volatile memory is fast, it loses its data when power is removed. Examples of volatile memory include static random access memory (SRAM) and dynamic random access memory (DRAM).

Nonvolatile memory is slower than volatile memory, but nonvolatile memory retains its state when power is removed. Nonvolatile memory is generally used to store data that needs to be saved for long periods of time or needs some degree of security. Examples of such data are BIOS, program code, and system software. Nonvolatile memory devices include read only memory (ROM), EPROM, EEPROM, flash, magnetic storage media, compact disks, laser disks, and optical disks.

Some memory cells have been developed that include both a volatile memory circuit and a nonvolatile memory circuit. For example, U.S. Pat. Nos. 4,510,584, 4,538,246, 4,638,465, and 5,353,248, disclose memory cells having a nonvolatile circuit that stores the state of a volatile circuit such that data stored in the volatile memory circuit is not lost when power is removed from the memory cell. The size of these memory cells are larger than the size of conventional volatile memory cells to accommodate the additional nonvolatile circuitry. Thus, the number of memory cells including both volatile and nonvolatile circuits is less than the number of conventional volatile memory cells per area of silicon. Therefore, what is needed is a mechanism for including a volatile and nonvolatile memory function in a memory cell without substantially enlarging the size of the memory cell.

Additionally, complex circuitry or additional power supply voltages may be required to control the operation of conventional memory cells having volatile and nonvolatile memory circuits. The circuits may require additional commands to invoke their operation or additional power supply voltages to program the nonvolatile memory circuit of the memory cell. Thus, what is needed is a mechanism for including a volatile and nonvolatile memory function in a memory cell while simplifying the circuitry required to operate the memory cell.

Typically read only nonvolatile memory devices such as ROMs are also used to store important data that a system does not wish a user to change. For example, a ROM device may store BIOS, system software, or other program code (e.g., video game code). To alter this data, a system typically reads out the data from the nonvolatile memory device, and then writes the data to a volatile memory device such as an SRAM device. Depending upon the size of the data copied to the SRAM device, this can require a significant amount of operating time. Therefore, what is needed is a volatile memory that has a nonvolatile memory capacity that can be accessed by a system without first copying the nonvolatile memory data to a volatile memory cell. Also, what is needed is a nonvolatile memory that has substantially the same speed (i.e., access time) as volatile memory.

SUMMARY OF THE INVENTION

In one embodiment, the present invention concerns a memory device including a first block of random access memory (RAM) cells having preprogrammed states, a second block of random access memory cells, and a select circuit configured to reset the first block of RAM cells to their preprogrammed states.

When the first block of memory cells are reset to their preprogrammed states, the first block of memory cells may function as ROM memory cells that may be accessed at RAM speeds. The first block of RAM cells may not require additional nonvolatile circuitry in order to perform the ROM function; rather, the first block of RAM cells may each be configured to operate as both a volatile and nonvolatile memory cell using the same cell structure. For one embodiment, the select circuit alters the power applied to the first block of RAM cells to cause these RAM cells to perform a ROM function. Since, the first block of RAM cells may store RAM data when the device operates in RAM mode, and may store preprogrammed ROM data when reset by the select circuit, the first block of RAM cells may have a storage capacity that is greater than the number of RAM cells in the first block.

In another embodiment, a RAM cell may be configured to include a pair of cross-coupled CMOS inverters each having a PMOS pull-up transistor and an NMOS pull-down transistor. The NMOS transistors may have substantially matched geometries. The first PMOS transistors may have substantially different lengths to unbalance the RAM cell and preprogram it to a preferred state. Multiple RAM cells may be configured in this was so as to program a block of RAM cells to store ROM data in a volatile memory cell.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A RAM device with ROM functionality is disclosed. For one embodiment, a memory device includes a first array of random access memory (RAM) cells having preprogrammed states, a second array of random access memory cells, and a select circuit configured to reset the first array of RAM cells to their preprogrammed states.

When the first array of memory cells are reset to their preprogrammed states, the first array of memory cells may function as ROM memory cells that may be accessed at RAM speeds. The first array of RAM cells may not require additional nonvolatile circuitry in order to perform the ROM function; rather, the first block of RAM cells may each be configured to operate as both a volatile and nonvolatile memory cell using the same cell structure.

For one embodiment, the select circuit toggles or pulses the power applied to the first array of RAM cells to cause these RAM cells to switch to a ROM function. The RAM cells in the first array may provide the ROM function by unbalancing the RAM cells to preprogram the cells. Program code may then be stored in the first array of RAM cells such that when the select circuit toggles the power supplied to the first array, these RAM cells are set to their preprogrammed ROM states.

Since, the first block of RAM cells may store RAM data when the device operates in RAM mode, and may store preprogrammed ROM data when reset by the select circuit, the first block of RAM cells may have a storage capacity that is greater than the number of RAM cells in the first block. In one embodiment, an additional address pin may be provided on an SRAM device that enables the SRAM device to select between ROM memory space and RAM memory space using the same physical memory of the SRAM device.

In another embodiment, a RAM cell may be configured to include a pair of cross-coupled CMOS inverters each having a PMOS pull-up transistor and an NMOS pull-down transistor. The NMOS transistors may have substantially equal or matched geometries. The PMOS transistors may have substantially different lengths to unbalance the RAM cell and preprogram it to a preferred state. Multiple RAM cells may be configured in this way so as to program a block of RAM cells to store ROM data in a volatile memory cell.

Figure 1:
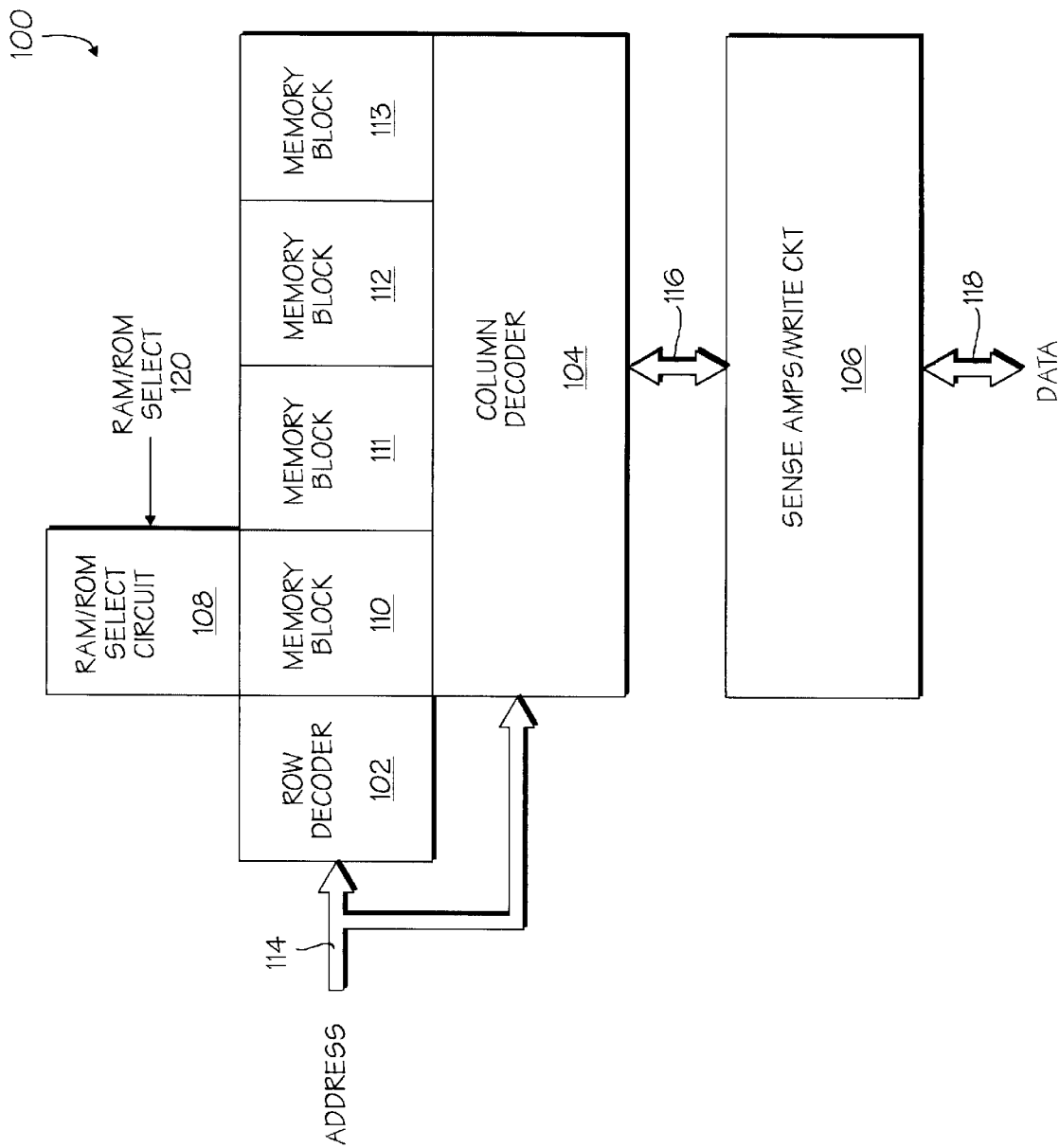
FIG. 1 shows a block diagram of one embodiment of an SRAM device configured in accordance with the present invention.

FIG. 1 shows a block diagram of one embodiment of SRAM device 100 configured in accordance with the present invention. SRAM 100 includes a memory array 122 that may be partitioned into a plurality of memory blocks or arrays 110–113. While four memory blocks are shown in FIG. 1, memory array 122 may be partitioned into any number of memory blocks.

Each memory block includes a plurality of volatile RAM cells. A RAM cell may be selected or addressed by supplying an address on address bus 114 to row decoder 102 and column decoder 104. Row decoder 102 may select a row or word line within one or more of memory blocks 110–113, and column decoder 104 may select bit lines for the addressed RAM cell. Data may then be read from or written to the addressed RAM cell by sense amplifiers and write circuit 106 via buses 116 and 118. Other configurations for addressing RAM cells and reading or writing data to the RAM cells may also be used as generally known in the art.

SRAM 100 also includes RAM/ROM select circuit 108 that is configured to cause memory block 110 to switch from a RAM mode of operation to a ROM mode of operation. In one embodiment, RAM/ROM SELECT signal 120 may cause RAM/ROM select circuit 108 to alter the power supplied to one or more addressed RAM cells in memory block 110, and cause the selected RAM cell(s) to be reset to a preprogrammed state. The preprogrammed state may store ROM code or data. The preprogrammed data may be BIOS, system software, or other program code such as video game code that a system or user may wish to access. The ROM data may also include identification information for SRAM 100, identification of code sections, or identification of memory sections in an addressable memory space. As will be described in more detail below, the selected RAM cells in memory block 110 may be preprogrammed during the manufacturing process SRAM device 100.

The ROM code accessed in memory block 110 may subsequently be altered by switching memory block 110 back to RAM mode. For example, this may allow a program user to alter the program code stored in the ROM of memory block 110 while preserving the original program code.

For one embodiment, RAM/ROM SELECT signal 120 may be generated internal to SRAM 100. For another embodiment, RAM/ROM SELECT signal 120 may be supplied via an external pin that indicates whether SRAM 100 should interpret the address on address bus 114 as a RAM address or a ROM address.

For another embodiment, RAM/ROM SELECT signal 120 may be provided as an address signal on an external address pin. The address signal may indicate whether SRAM 100 is operating in RAM address space or ROM address space. For example, if the total physical size of memory array 122 is approximately 1 million RAM cells or 1 Megabits, then it would typically require 20 address pins (A0–A19) to address this memory space. By adding an additional address pin (A20) corresponding to RAM/ROM SELECT signal 120, up to 1 Megabits of additional ROM memory space could be addressed using the same physical memory provided by memory array 122. Thus, SRAM 100 effectively has a storage capacity that is greater than the number of RAM cells in memory array 122.

SRAM 100 may also include a separate RAM/ROM circuit for each of memory blocks 110–113 so that each memory block may operate as volatile RAM cells and also function as ROM cells. ROM code may thus be stored in one or more of memory blocks 110–113.

Figure 2:
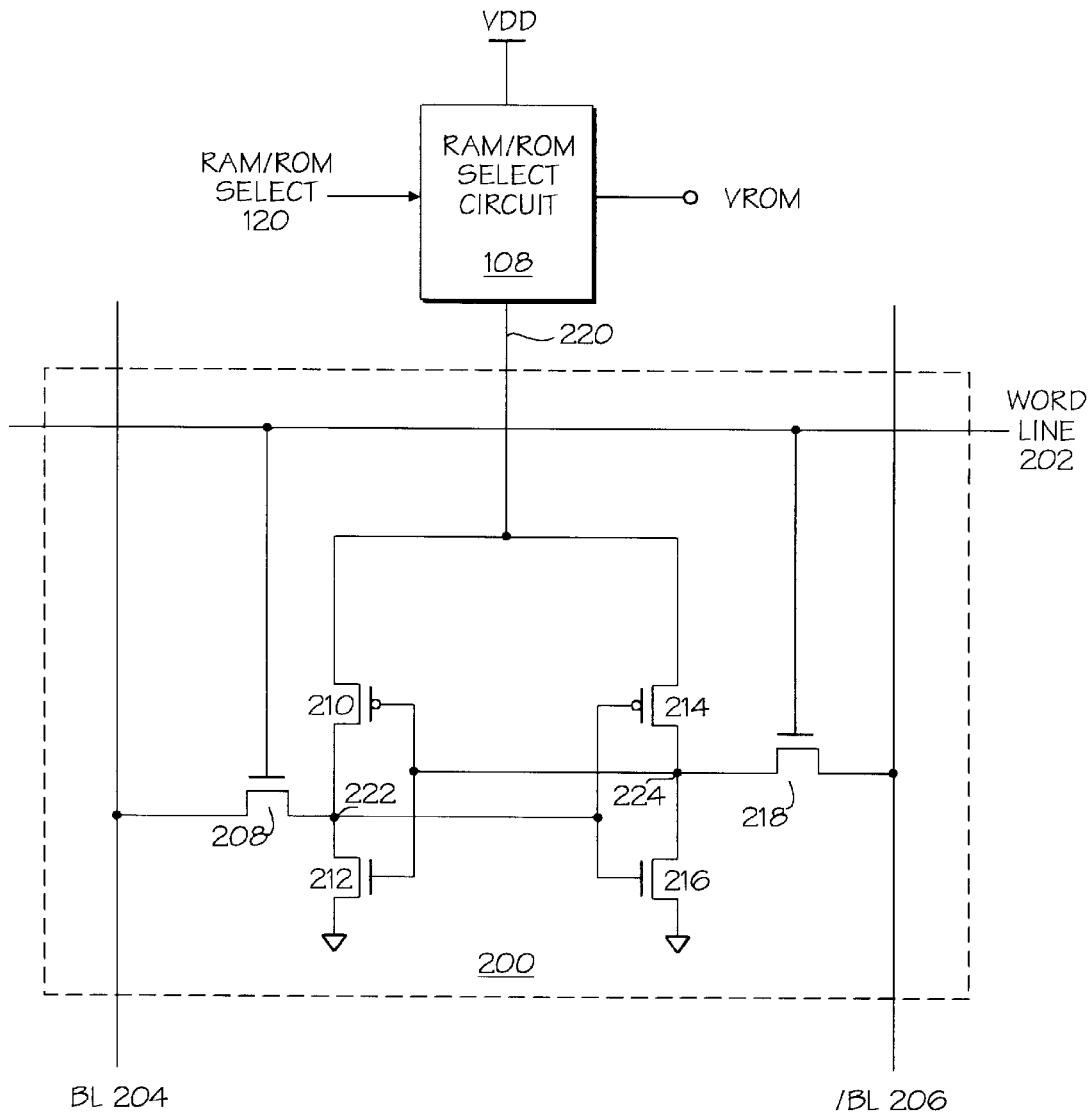
FIG. 2 shows a circuit diagram of one embodiment of a RAM/ROM select circuit and an SRAM cell according to the present invention.

FIG. 2 shows RAM/ROM select circuit 108 coupled to one SRAM cell 200. SRAM cell 200 may be one RAM cell in memory block 110 or any other memory block. RAM/ROM select circuit 108 may be coupled to one or more RAM cells in memory block 110.

SRAM cell 200 is a six transistor cell that may operate as a static RAM cell or be reset by RAM/ROM select circuit 108 to a preprogrammed state storing ROM code.

SRAM cell 200 includes two cross-coupled CMOS inverter circuits. The first inverter circuit includes PMOS transistor 210 coupled in series with NMOS transistor 212. PMOS transistor 210 has a source coupled to RAM/ROM select circuit 108, a drain coupled to the drain of NMOS transistor 212 at node 222, and a gate coupled to the gate of NMOS transistor 212 and node 224. NMOS transistor 212 has a source coupled to ground. The second inverter circuit includes PMOS transistor 214 coupled in series with NMOS transistor 216. PMOS transistor 214 has a source coupled to the source of PMOS transistor 210 and RAM/ROM select circuit 108, a drain coupled to the drain of NMOS transistor 216 at node 224, and a gate coupled to the gate of NMOS transistor 216 and node 222. The source of NMOS transistor 216 is coupled to ground.

SRAM cell 200 also includes pass gates 208 and 218. Pass gate 208 has a source (drain) terminal coupled to node 222 and a drain (source) terminal coupled to bit line BL 204. Pass gate 218 has a source (drain) coupled to node 224 and a drain (source) terminal coupled to bit line bar /BL 206. BL 204 and /BL 206 may be coupled to column decoder 104. The gates of pass transistors 208 and 218 are coupled to word line 202. Word line 202 may be coupled to row decoder 102. When word line 202 is asserted to a high logic state, pass gates 208 and 218 are enabled to pass the voltages on BL 204 and /BL 206 to nodes 222 and 224, respectively.

When memory cell 200 is operating in SRAM mode, RAM/ROM SELECT signal 120 causes RAM/ROM select circuit 108 to couple power supply VDD to line 220 and the sources of PMOS transistors 210 and 214. When word line 202 is driven to a high logic state, data may be written to nodes 222 and 224 by driving voltages on BL 204 and /BL 206, and data may be read from nodes 222 and 224 by sensing the voltages passed to BL 204 and /BL 206.

In ROM mode, RAM/ROM SELECT signal 120 causes RAM/ROM select circuit 108 to alter the voltage supplied to line 220 and the sources of PMOS transistors 210 and 214 such that SRAM cell 200 is reset to its preprogrammed state. For example, in ROM mode, RAM/ROM SELECT signal 120 may cause RAM/ROM select circuit 108 to select a second voltage source VROM to apply a voltage or power different than VDD to line 220 and the sources of PMOS transistors 210 and 214. After a period of time that enables SRAM cell 200 to be reset to its preprogrammed ROM mode, RAM/ROM SELECT signal 120 may then cause RAM/ROM select circuit 108 to couple VDD to line 220 such that the preprogrammed data stored in SRAM cell 200 may be read. For one embodiment, the period of time necessary to cause SRAM cell 200 to be reset to its preprogrammed state may be approximately 2 to 25 nanoseconds (ns). For another embodiment, the period of time may be approximately 5 to 15 ns. Other periods of time may be used.

For one embodiment, SRAM cell 200 is reset to its ROM mode when RAM/ROM select signal 120 causes RAM/ROM select circuit 108 to couple VROM to line 220 when VROM is a logic zero, BL 204 is driven to a logic zero, and /BL 206 is driven to a logic zero. In this configuration, VROM may be approximately one threshold voltage above ground while nodes 222 and 224 are driven to approximately ground by BL 204 and /BL 206 via pass gates 208 and 218, respectively.

Figure 3:
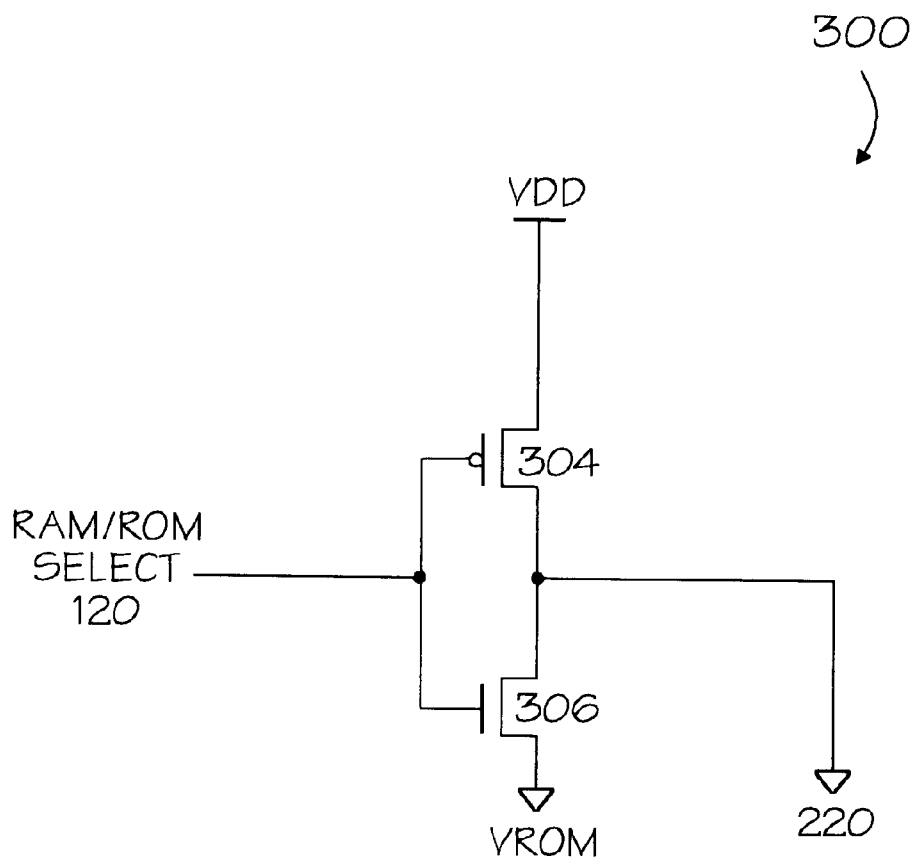
FIG. 3 shows a circuit diagram of one embodiment of the RAM/ROM select circuit of FIG. 2.

For one embodiment, VROM is approximately zero volts or ground. FIG. 3 shows RAM/ROM select circuit 300 that is one embodiment of RAM/ROM select circuit 108 where VROM is approximately zero volts or ground. RAM/ROM select circuit 300 is a CMOS inverter that includes PMOS transistor 304 coupled in series with NMOS transistor 306. RAM/ROM SELECT signal 120 is coupled to the gates of NMOS transistor 306 and PMOS transistor 304. NMOS transistor 306 has its source coupled to VROM which is approximately zero volts or ground, and its drain coupled to line 220 and the drain of PMOS transistor 304. PMOS transistor 304 has its source coupled to VDD.

In operation, when SRAM cell 200 operates in the RAM mode, RAM/ROM SELECT signal 120 is low causing NMOS transistor 306 to be cut off and PMOS transistor 304 to be on such that VDD is coupled to line 220. When SRAM cell 200 operates in the ROM mode, RAM/ROM SELECT signal 120 is driven high for a period of time causing PMOS transistor 304 to be cut off and NMOS transistor 306 to be on such that ground is coupled to line 220. After a period of time, RAM/ROM SELECT signal 120 is driven low again causing VDD to be applied to line 220 and powering up the sources of PMOS transistors 210 and 214. Cycling the power applied to SRAM cell 200 causes SRAM cell 200 to be reset to a preprogrammed mode or preferred state that may be preset during manufacturing of SRAM cell 200 as will be described in more detail below.

RAM/ROM SELECT signal 120 may be driven by a one shot circuit, RC delay circuit, or other delay circuit that enables RAM/ROM SELECT signal 120 to be driven high for a period of time to switch SRAM cell 200 to ROM mode, and then return to a low state.

RAM/ROM select circuit 300 is only one embodiment of a select circuit that may be used to drive different voltages to SRAM cell 200 in response to RAM/ROM SELECT signal 120. Other switching circuits generally known in the art may also be used including other types of inverters such as depletion load inverters and resistive load inverters. A multiplexer may also be used.

As previously described, when the power supplied to SRAM cell 200 is altered, SRAM cell 200 switches to a preprogrammed ROM state. In one embodiment, SRAM cell 200 may be programmed to store ROM code by unbalancing the CMOS inverters in SRAM cell 200 such that when the SRAM cell 200 is powered down and then powered up, it will have a predetermined preferred state. That is, upon power-up, the voltage at nodes 222 and 224 will always settle into a predetermined preprogrammed high or low state. SRAM cells in a given memory block, such as memory block 110, may be configured to power-up in different preprogrammed states consistent with the ROM code stored in the memory block.

SRAM cell 200 can be configured to power-up in a preferred or preprogrammed state by adjusting the characteristics of the PMOS transistors 210 and 214, NMOS transistors 212 and 216, or pass gates 208 and 218. For example, the threshold voltages of transistors 210–218 may be altered, or the geometries of NMOS transistors 212 and 216 or pass transistor 208 and 218 may be mismatched. This may be accomplished using traditional fabrication methods.

For one embodiment, the stability of SRAM cell 200 may be dominated by NMOS transistors 212 and 216 and pass transistors 208 and 218. For this embodiment, NMOS transistors 212 and 216 may have approximately the same or matched geometries (e.g., channel length and width, threshold voltage, etc.), pass transistors 208 and 218 may also have approximately the same geometries, and PMOS transistors 210 and 214 may have their channel lengths mismatched. Mismatching the channel lengths of PMOS transistors 210 and 214 causes a change in the drive current of each CMOS inverter. This will cause SRAM cell 200 to be powered up in a preferred state.

For example, if PMOS transistor 210 has a smaller channel length than PMOS transistor 214, then the drive current provided by PMOS transistor 210 will be greater than the drive current provided by PMOS transistor 214. As the sources of PMOS transistors are ramped from approximately zero volts to VDD, node 222 will reach the threshold of NMOS transistor 216 before node 224 reaches the threshold of NMOS transistor 212. This will cause SRAM cell 200 to be powered up in a ROM configuration with a preprogrammed state having a high state at node 222 and a low state at node 224. Conversely, if PMOS transistor 214 has a smaller channel length than PMOS transistor 210, then SRAM cell 200 will be powered up in a ROM configuration with a preprogrammed state having a high state at node 224 and a low state at node 222.

For one embodiment, the channel lengths of the PMOS transistors 210 and 214 may be mismatched by approximately 5–25%. For example, in a CMOS process having a minimum channel length of approximately 0.5 microns, one of PMOS transistors 210 and 214 may be drawn or fabricated at the minimum size and the other may be drawn or fabricated to be approximately 10% greater (i.e., approximately 0.55 microns).

By changing the lengths of PMOS transistors 210 and 214 the size of the memory cell may be minimally impacted. For one embodiment, the size of the memory cell may not be enlarged at all.

In another embodiment, the size of SRAM cell 200 may also not be impacted by adjusting the threshold voltages of PMOS transistors 210 and 214. A threshold voltage of one of these transistors may be lowered by selectively implanting a p-type material such as Boron into the channel region of one of these transistors. For example, if the threshold voltage of PMOS transistor 210 is lowered by this technique, then when SRAM 200 is powered up from approximately zero volts to VDD, node 222 will rise in voltage faster than node 224. Thus, SRAM 200 will be preprogrammed to power up in a preferred ROM state having a high state on node 222 and a low state on node 224.

By selectively preprogramming memory cells in memory block 110, memory block 110 may be preprogrammed with ROM code that can be accessed when RAM/ROM select circuit 108 cycles the power applied to the memory block. In this manner, SRAM cell 200 stores both ROM data and RAM data. Thus, SRAM cell 200 has a storage capacity of two bits instead of one bit, and can store four states of information rather than two states of information.

Furthermore, the size of the SRAM cell 200 may be only minimally impacted or not impacted at all to achieve the dual functionality of the memory cell. The ROM code stored in SRAM cell 200 may also be accessed at RAM speeds as reading the ROM data is performed in the same manner as reading SRAM cell 200 when it operates in the RAM mode. For one embodiment, the ROM data stored in SRAM cell 200 may be accessed in approximately 5–25 ns.

Figure 4:
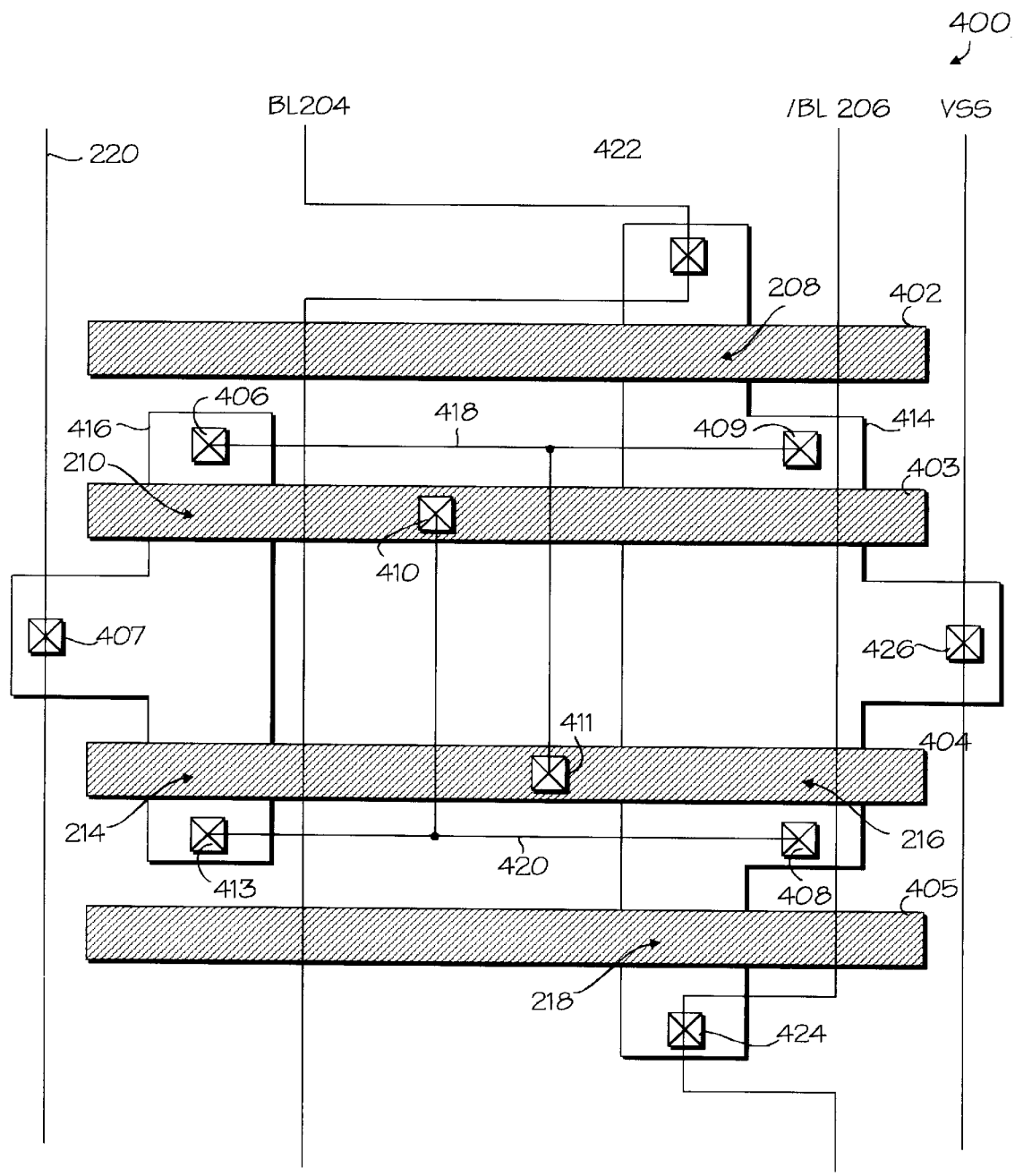
FIG. 4 shows a top view of one embodiment of a layout of the SRAM cell of FIG. 2.

The ability of RAM/ROM select circuit 108 to provide a plurality of voltages on line 220 to a column (or row) of RAM cells such as SRAM cell 200 may be facilitated by the layout of the cell. FIG. 4 shows a top view of SRAM cell 400 that is one embodiment of SRAM cell 200. SRAM cell 400 may facilitate the routing of line 220 to a column of SRAM cells.

SRAM cell 400 includes diffusion region 416 in which PMOS transistors 210 and 214 are fabricated, and diffusion region 414 in which NMOS transistors 212 and 216 and pass transistors 208 and 218 are fabricated. The gate for transistor 208 is formed by structure 208. The gates for transistors 212 and 210 are formed by structure 403. The gates for transistors 214 and 216 are formed by structure 404. The gate for transistor 218 is formed by structure 405. Each of structures 402–405 may be polycrystalline silicon or other materials.

Interconnect 418 couples the drain of transistor 210 at contact 406 to the drain of transistor 212 and one terminal of transistor 208 at contact 409. Interconnect 418 also couples contacts 406 and 409 to the gates of transistors 214 and 216 at contact 411. Interconnect 420 couples the drain of transistor 214 at contact 408 to the drain of transistor 216 and one terminal of transistor 218 at contact 413. Interconnect 420 also couples contacts 408 and 413 to the gates of transistors 210 and 212 at contact 410. One terminal of transistor 208 is coupled to BL 204 by contact 422. One terminal of transistor 218 is coupled to /BL 206 by contact 424.

Bit lines BL 204 and /BL 206 may be formed from a metal layer or other conductive material. Line 220 may also be formed from the same metal layer or a different metal layer. Line 220 may be coupled to diffusion region 416 through contact 407. VSS may be coupled to diffusion region 414 by contact 426. Alternatively, line 220 and/or VSS may be coupled to their respective diffusion regions by means a via and then contacts 407 and 426, respectively.

If the channel lengths of PMOS transistors 210 or 214 were mismatched, SRAM cell 400 may not be significantly impacted, or may not increase at all. For example, increasing the width of gate structure 404 by approximately 10% may only increase the size of SRAM cell 400 by approximately one percent.

In other embodiments, many other RAM cell layouts may be used to facilitate providing line 220 to a number of RAM cells in a column or a row. Additionally, other RAM cell layouts may be used that do not significantly increase in size if the channel lengths of PMOS transistors 210 and 214 are mismatched.

While SRAM cell 200 has been illustrated as a six transistor cell, other cell configurations may also be used and modified to be preprogrammed into a preferred state to store ROM code. For example, memory cells with resistive loads or depletion loads may be used. Additionally, a five transistor cell as described in the U.S. Pat. No. 5,453,950 may also be used. U.S. Pat. No. 5,453,950 is hereby incorporated by reference.

The present invention has been described according to SRAM 100. However, the present invention may be practiced in multi-port RAM devices including dual-port RAMs, FIFOs, and LIFOs such that preprogrammed code may be accessed in all or a portion of the RAM cells by altering the power applied to blocks of RAM memory. The present invention may also be used in RAM memory that are stand alone chips or are incorporated into other integrated circuits such as embedded controllers, microprocessors, and the like.

Figure 5:
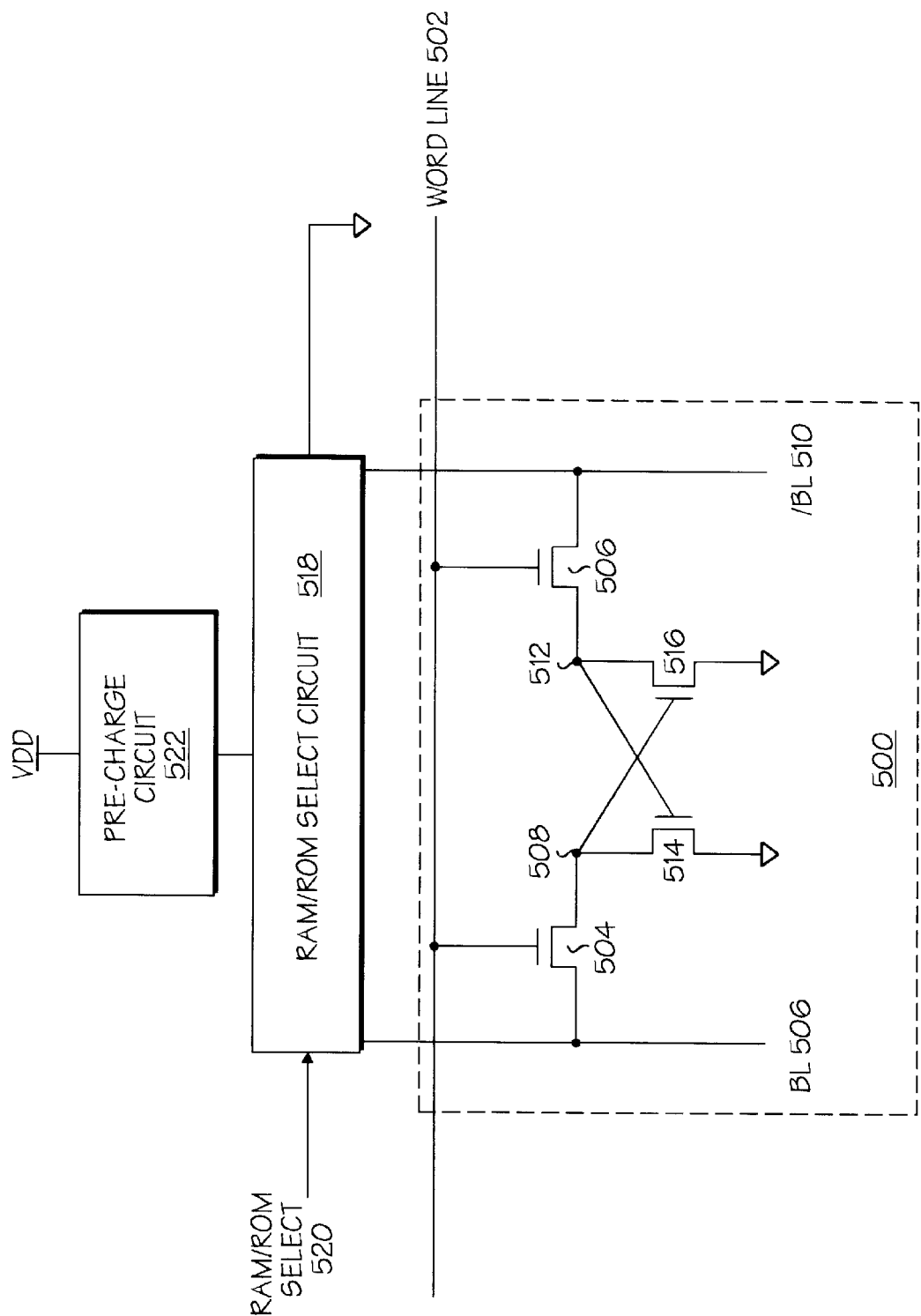
FIG. 5 shows a circuit diagram of one embodiment of DRAM cell coupled to a RAM/ROM select circuit.

In another embodiment, the present invention may be used in DRAM devices having bi-stable storage characteristics. For example, the present invention may be used in a DRAM device having four transistor DRAM cell 500 as shown in FIG. 5. The four transistor DRAM cell 500 includes a word line 502 coupled to the gates of pass transistors 504 and 506. The source (drain) of pass transistor 504 is coupled to bit line BL 506, and the drain (source) of pass transistor 504 is coupled to node 508. The source (drain) of pass transistor 506 is coupled to bit line bar /BL 510, and the drain (source) of pass transistor 506 is coupled to node 512. Transistor 514 has a gate coupled to node 512, a drain coupled to node 508, and a source coupled to ground. Transistor 516 has a gate coupled to node 508, a drain coupled to node 512, and a source coupled to ground.

BL 506 and /BL 510 are coupled to RAM/ROM select circuit 518 that in response to RAM/ROM select signal 520 causes DRAM cell 500 to operate in either a RAM mode or a ROM mode. For example, when RAM/ROM select signal 520 is in one state, RAM/ROM select circuit 518 may couple BL 506 and /BL 510 to pre-charge circuit 522. Pre-charge circuit 522 may be coupled to power supply VDD. For one embodiment, pre-charge circuit 522 is one or more p-channel diode connected transistors. Other pre-charge circuits may also be used.

RAM/ROM select signal 520 may also cause RAM/ROM select circuit 518 to couple BL 506 and /BL 510 to ground while word line 502 is driven high. This will cause nodes 508 and 512 to be set to approximately ground. After a period of time, RAM/ROM select 520 may then cause RAM/ROM select circuit 518 to be coupled again to pre-charge circuit 522. When the geometries or threshold voltages of transistors 514 and 516 are mismatched and/or when the geometries of pass gates 504 and 506 are mismatched, then DRAM cell 500 may power up in a preprogrammed state. In this manner, DRAM cell 500 may store RAM code and also store preprogrammed ROM code. Additionally, one of a plurality of blocks of DRAM cells may be reset in a DRAM device in order to access ROM code stored in the block.

Figure 6:
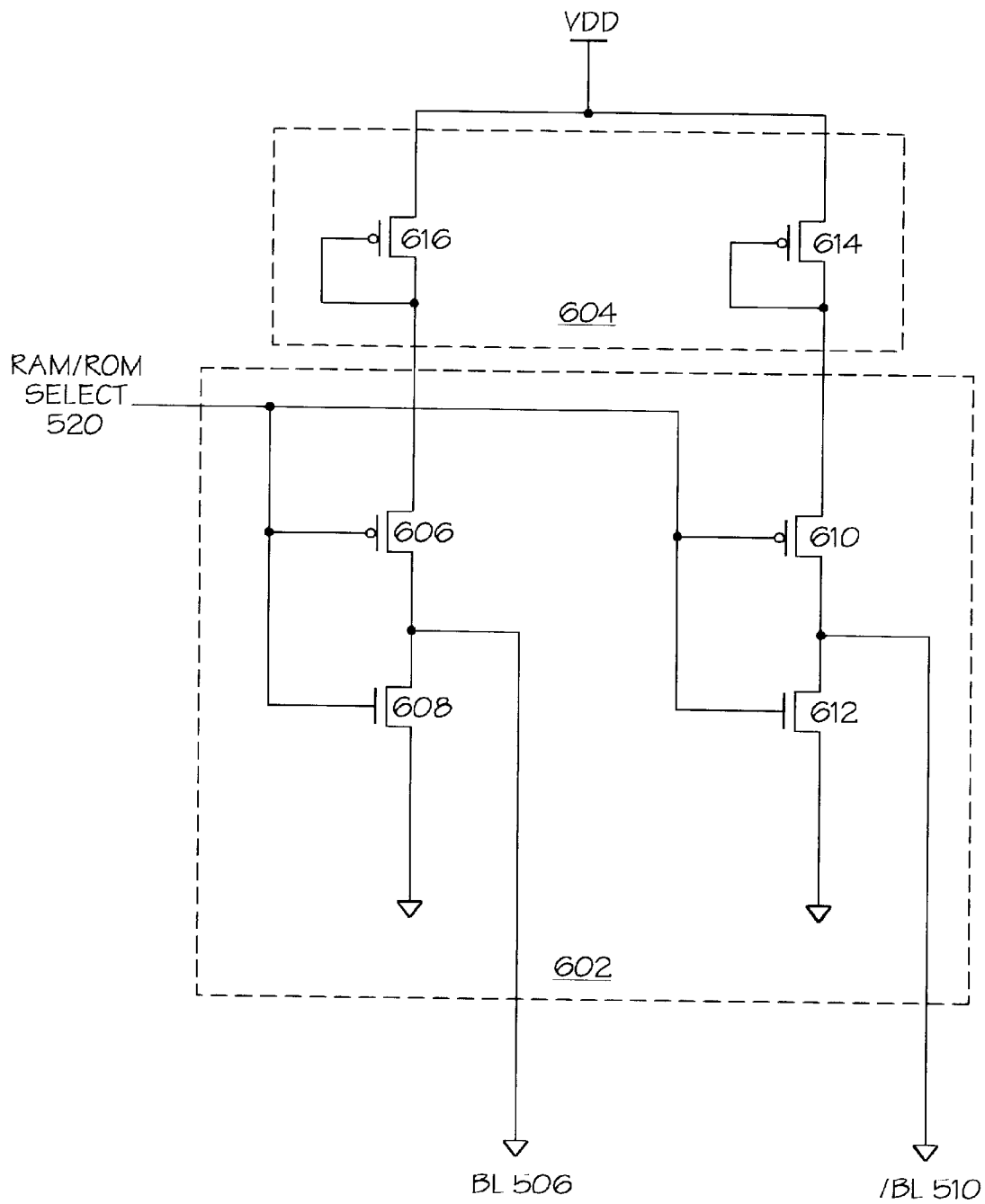
FIG. 6 shows a circuit diagram of one embodiment of the RAM/ROM select circuit of FIG. 5.

FIG. 6 shows RAM/ROM select circuit 602 coupled to pre-charge circuit 604. RAM/ROM select circuit is one embodiment of a RAM/ROM select circuit 518. Pre-charge circuit 604 is one embodiment of pre-charge select circuit 522.

RAM/ROM select circuit 602 includes a CMOS inverter coupled to each of BL 506 and /BL 510. A first inverter includes PMOS transistor 606 coupled in series with NMOS transistor 608. The input of the first inverter is coupled to RAM/ROM select signal 520 and the gates of PMOS transistor 606 and NMOS transistor 608. The output of the first inverter is coupled to BL 506 and the drains of PMOS transistor 606 and NMOS transistor 608. The source of NMOS transistor 608 is coupled to ground. The source of PMOS transistor 606 is coupled to the drain and gate of diode connected PMOS transistor 616. The source of PMOS transistor 616 is coupled to VDD.

A second inverter includes PMOS transistor 610 coupled in series with NMOS transistor 612. The input of the first inverter is coupled to RAM/ROM select signal 520 and the gates of PMOS transistor 610 and NMOS transistor 612. The output of the first inverter is coupled to BL 506 and the drains of PMOS transistor 610 and NMOS transistor 612. The source of NMOS transistor 612 is coupled to ground. The source of PMOS transistor 610 is coupled to the drain and gate of diode connected PMOS transistor 614. The source of PMOS transistor 614 is coupled to VDD.

In operation, when RAM/ROM select signal 520 is low, transistors 608 and 612 are off, transistors 606 and 610 are on, and bit lines BL 506 and /BL 510 are pulled towards VDD by transistors 616 and 614, respectively. In this configuration, DRAM cell 500 may operate in RAM mode.

When RAM/ROM select signal 520 is high, transistors 608 and 612 are on, transistors 606 and 610 are off, and bit lines BL 506 and /BL 510 are pulled towards ground. In this configuration, DRAM cell 500 may operate in ROM mode.

RAM/ROM select circuit 602 is only one embodiment of a select circuit that may be used to drive different voltages to DRAM cell 500 in response to RAM/ROM SELECT signal 520. Other switching circuits generally known in the art may also be used including other types of inverters such as depletion load inverters and resistive load inverters. A multiplexer may also be used.

In yet another embodiment, the present invention may be used in video random access memory (VRAM) devices. For example, a VRAM device typically includes dual-port RAM cells that may store frame information for display on a display device. All or a portion of the RAM cells may be configured to store preprogrammed ROM data that may correspond to one or more screens of information. For example, these may be background screens or a series or preprogrammed screen data. The same memory may then be used by a system to write new screen information.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
   a plurality of memory cells configured to store both random access memory (RAM) data and read only memory (ROM) data; and
   a select circuit coupled to the plurality of memory cells and configured to enable access to the RAM data or ROM data in response to an address signal.

2. The circuit of claim 1, wherein the select circuit alters power supplied to the first plurality of RAM cells in response to the address signal.

3. The circuit of claim 1, wherein one of the plurality of RAM cells comprises a first PMOS transistor having a first length and a second PMOS transistor having a second length different than the first length.

4. The circuit of claim 1, wherein the select circuits enable access to the RAM data when the address signal is in a first state, and wherein the select circuit enables access to the ROM data when the address signal is in a second state.

5. The circuit of claim 1, wherein the first plurality of RAM cells are static RAM cells.

6. The circuit of claim 1, wherein the first plurality of RAM cells are dynamic RAM cells.

7. The circuit of claim 1, wherein the select circuit is configured to enable access to the ROM data in response to the address signal by cycling power supplied to the memory cells from a first voltage to a second voltage, and from the second voltage to the first voltage, wherein the second voltage is less than the first voltage.

8. The circuit of claim 7, wherein one of the memory cells comprises a first PMOS transistor having a first length and a second PMOS transistor having a second length different than the first length.

9. The circuit of claim 7, wherein one of the memory cells is a static RAM cell.

10. The circuit of claim 7, wherein one of the memory cells is a dynamic RAM cell.

11. The circuit of claim 1, wherein one of the memory cells comprises a dynamic random access memory (DRAM) cell.

12. The circuit of claim 11, further comprising:
    a word line coupled to the DRAM cell;
    a first bit line coupled to the DRAM cell and the select circuit;
    a second bit line coupled to the DRAM cell and the select circuit; and
    a pre-charge circuit coupled to the first and second bit lines.

13. The circuit of claim 12, wherein the select circuit provides the same logic levels to the first and second bit lines, and subsequently couples the first and second bit lines to the pre-charge circuit to enable access to a bit of the ROM data in the DRAM cell.

14. The circuit of claim 12, wherein the DRAM cell comprises:
    a pair of cross-coupled transistors; and
    a pair of pass transistors coupling the cross-coupled transistors to the first and second bit lines.

15. A method of retrieving preprogrammed data from a random access memory (RAM) cell, comprising the step of:
    cycling power applied to the RAM cell from a first voltage to a second voltage, and from the second voltage to the first voltage, wherein the second voltage is less than the first voltage, wherein the cycling step occurs in response to an address signal.

16. The method of claim 12, wherein, the RAM cell is coupled to a pair of bit lines, and the method further comprises the step of driving the bit lines to a same voltage while the power applied to the RAM cell is at the second voltage.

17. A memory circuit comprising:

a random access memory (RAM) address space implemented in a plurality of memory cells;

a read only memory (ROM) address space implemented in the plurality of memory cells; and a select circuit configured to address the RAM address space or the ROM address space in response to an address signal.

* * * * *